United States Patent
Li et al.

(10) Patent No.: US 7,117,471 B1
(45) Date of Patent: Oct. 3, 2006

(54) GENERATION OF DESIGN VIEWS HAVING CONSISTENT INPUT/OUTPUT PIN DEFINITIONS

(75) Inventors: Huimou Juliana Li, Sunnyvale, CA (US); Mehul R. Vashi, San Jose, CA (US); Qingqi Wang, San Jose, CA (US); Andy H. Gan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 165 days.

(21) Appl. No.: 10/971,221

(22) Filed: Oct. 22, 2004

(51) Int. Cl.
*G06F 17/50* (2006.01)

(52) U.S. Cl. .................... 716/12; 716/1; 716/4; 716/18

(58) Field of Classification Search .................... 716/1, 716/2, 4, 6, 12, 18
See application file for complete search history.

(56) References Cited

U.S. PATENT DOCUMENTS

2003/0131325 A1* 7/2003 Schubert et al. ................ 716/4

OTHER PUBLICATIONS

U.S Appl. No. 10/966,554, filed Oct. 15, 2004, Roberts et al.
U.S Appl. No. 10/966,993, filed Oct. 15, 2004, Roberts et al.

* cited by examiner

*Primary Examiner*—Thuan Do
(74) *Attorney, Agent, or Firm*—LeRoy D. Maunu

(57) ABSTRACT

Generation of consistent connection data for a first circuit embedded in a second circuit. In one approach, a master file is established with design data that includes for each pin in the embedded circuit, a hardware description language (HDL) pin name from an HDL description of the embedded circuit, a schematic pin name of the second circuit to which a corresponding pin in the embedded circuit is to connect, a signal direction associated with the pin, and a name of a clock to trigger a signal on the pin. A plurality of design views are generated from the master file. Each design view has a unique format relative to the other design views and includes for each pin in the embedded circuit design, at least the HDL pin name, the associated schematic pin name, and a signal direction associated with the pin.

14 Claims, 5 Drawing Sheets

GENERATION OF DESIGN VIEWS HAVING CONSISTENT INPUT/OUTPUT PIN DEFINITIONS

FIELD OF THE INVENTION

The present invention generally relates to embedding circuitry within programmable logic circuitry.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDS), or in any other type of memory cell.

Other types of PLDs are programmed by applying a processing layer, such as a metal layer, that programmably interconnects the various elements on the device. These PLDS are known as mask programmable devices. PLDS can also be implemented in other ways, e.g., using fuse or antifuse technology. The terms "PLD" and "programmable logic device" include but are not limited to these exemplary devices, as well as encompassing devices that are only partially programmable.

Each new generation of chip technology allows additional functionality to be integrated on a single chip. Functions that were once implemented on several chips can now be integrated on a single chip. There are numerous applications in which entire systems are implemented on a single chip ("system on a chip"). In one application, a general purpose processor may be embedded within PLD circuitry.

In order to manufacture a chip with a processor embedded in PLD circuitry, an overall circuit design of the combined circuitry must be prepared. Part of this overall design may involve special interface circuitry that connects the processor input/output (I/O) pins to desired pins in the PLD circuitry. A processor may have many interface pins, perhaps thousands, which complicates the task of designing the interface.

The challenges associated with coordinating the many pin-to-pin connections arise in the different design views that are used at different times in the design process. For example, one view provides information for routing signals between the processor pins and PLD pins along with setting necessary default values; another view provides a schematic representation that may be used to view signal routes; another view includes the physical coordinates of pins in a placed and routed circuit; and another view provides test information for testing behavior of the circuit.

The information used to prepare these views may come from different groups having different responsibilities in preparing the overall circuit design. Coordinating pin definitions between the different groups, however, may be difficult. Consistency of pin definitions and connections between the different design views is critical for the circuit to operate correctly. Furthermore, changes in either the processor design or the design of the PLD circuitry may change the needed connections between the I/O pins of the processor and pins in the PLD circuitry. Thus, embedding a new version of a processor in the PLD circuitry may involve a significant amount of work in updating the interface design and ensuring consistency between the different design views.

The present invention may address one or more of the above issues.

SUMMARY OF THE INVENTION

Various embodiments of the invention support generating consistent connection data for a first circuit embedded in a second circuit. In one embodiment, a master file is established with design data that includes for each pin in the embedded circuit, a hardware description language (HDL) pin name from an HDL description of the embedded circuit, a schematic pin name of the second circuit to which a corresponding pin in the embedded circuit is to connect, a signal direction associated with the pin, and a name of a clock to trigger a signal on the pin. A plurality of design views are generated from the master file. Each design view has a unique format relative to the other design views and includes for each pin in the embedded circuit design, at least the HDL pin name, the associated schematic pin name, and a signal direction associated with the pin.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1A:
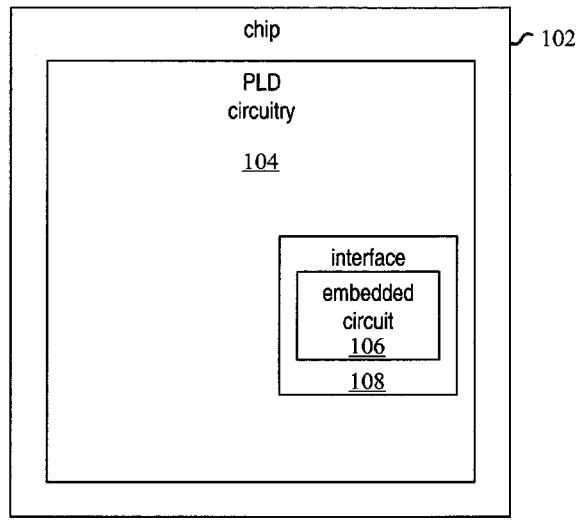
FIG. 1A illustrates a PLD chip having embedded circuitry.

FIG. 1A illustrates a PLD chip 102 in which circuitry 106 is embedded in the PLD circuitry 104. The embedded circuitry 106 may be a processor or an ASIC, for example. Interface circuitry 108 provides the interface between the embedded circuit and the PLD circuitry.

Figure 1B:
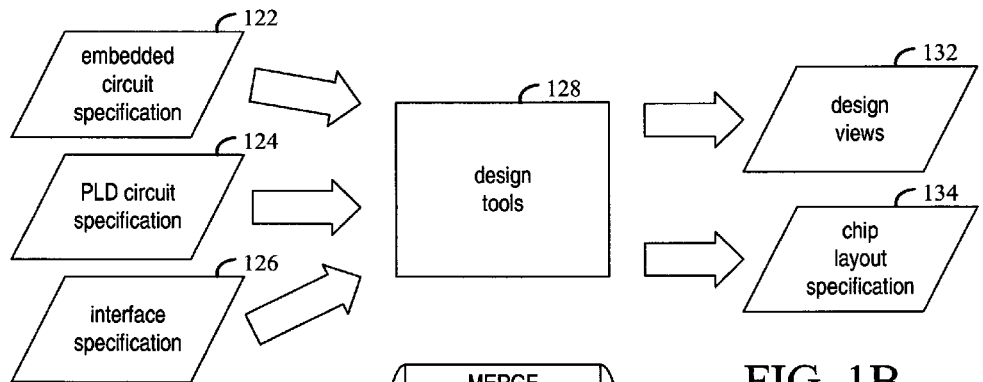
FIG. 1B is a data flow diagram that illustrates merging of the design specification of the embedded circuit with the PLD circuit specification.

FIG. 1B is a data flow diagram that illustrates merging of the design specification 122 of the embedded circuit, the PLD design specification 124, and an interface specification 126 by a design team using various design tools 128. The specifications 122, 124, and 126 are merged into chip layout specification 134.

A design team uses the various tools to create design views 132 that may be used in modeling and testing the overall design.

The pin definitions and pin-to-pin connections between the PLD circuitry and the embedded circuit need to be consistent across the design views 132. For example, the connections and the pin interfaces between the design views need to be made consistent for purposes of software modeling, storage of the design in a schematic database, specifying physical pin-to-pin connections, and testing.

The process of merging the embedded design specification with the PLD specification may be laborious and may present the design team with numerous challenges in making the pin specifications in the different design views consistent.

Figure 1C:
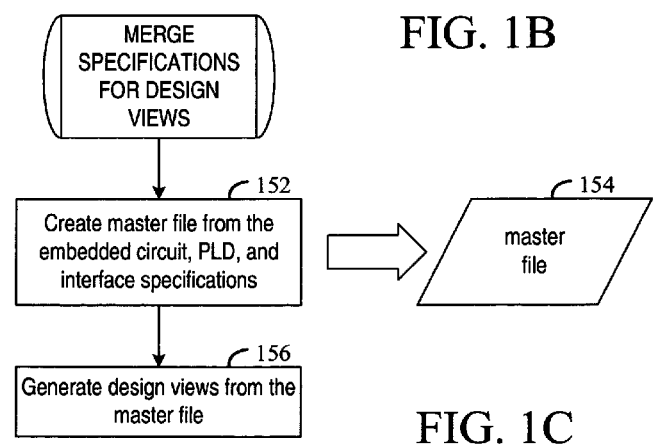
FIG. 1C is a flowchart of a process for merging the embedded circuit, PLD, and interface specifications for creating consistent design views in accordance with one or more embodiments of the invention.

FIG. 1C is a flowchart of a process for merging the embedded circuit, PLD, and interface specifications for creating consistent design views in accordance with one or more embodiments of the present invention. The process begins by generating (step 152) a master file 154 that contains for each pin in the embedded circuit: a designer-visible HDL pin name, a schematic PLD pin name (for use in a schematic database), the name of the clock that will trigger the pin, the mode of the pin (test vs. user), and whether the pin has a permanent default value. Additional information may be included depending on the need of the downstream design tools.

The information in the master file may be assembled based on information in the embedded circuit specification 122 and information in the interface specification 126. The schematic PLD pin names may be obtained from the PLD circuit specification 124 and interface specification 126.

Using the master file, along with other information needed for each particular design view, the different design views are generated (step 156). By using the same master file 154 to generate all the design views, the pin definitions in the different design views will be consistent, and the other sources of information used to generate the design views may be surveyed for consistency with the master file.

Figure 2:
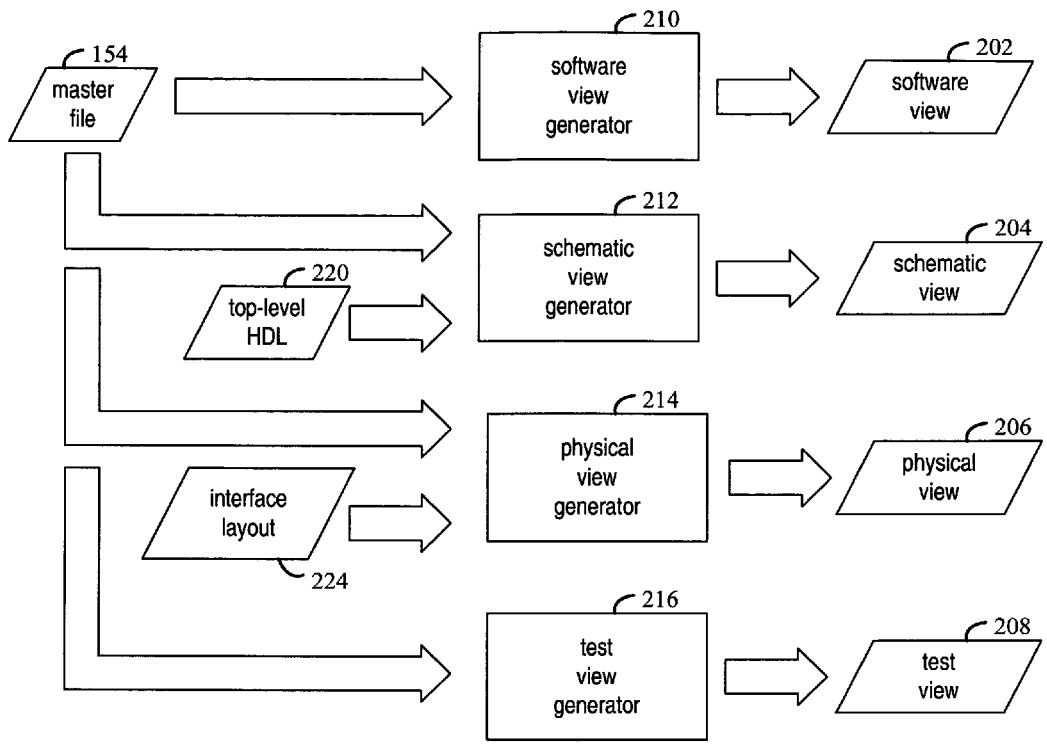
FIG. 2 is a data flow diagram that illustrates the different design views generated in accordance various embodiments of the invention.

FIG. 2 is a data flow diagram that illustrates the different design views generated in accordance with one or more embodiments of the invention. Each of the different design views 202, 204, 206, and 208 is generated by a respective one of design view generators 210, 212, 214, and 216.

Software view generator 210 generates the software view 202, schematic view generator 212 generates the schematic view 204, physical view generator 214 generates the physical view 206, and test view generator 216 generates test view 208.

The software view generator 210 uses information in the master file 154 in creating the software view 202. The software view includes for each signal, an HDL pin name; the name of the clock that triggers the signal at the pin; whether the signal at the pin is input or output; whether the signal has a default value; whether an optional inverter is to be used in the signal path; and whether the signal is visible in user mode, test mode or both. The software view 202 contains no information beyond that in the master file. However, the selected information is reformatted for use by tools such as those used in developing device models, simulation primitives and synthesis primitives.

The schematic view generator 212 uses information in the master file 154, along with top-level HDL code 220, to prepare a schematic view 204. The schematic view generator selectively reads from the master file 154 to determine which HDL pin name is mapped to which schematic PLD pin name. The schematic view generator also reads a header declaration from the top-level HDL 220 using the HDL pin names from the master file. The top-level HDL 220 describes the embedded circuit. The generator creates an HDL file that maps the one-to-one relationship between HDL pin names and schematic PLD pin names. This new HDL connection file is then imported into a schematic database (e.g., a database used by a Cadence schematic capture tool). From the schematic database, a schematic representation of the pin connections is created. This schematic representation may be later used to incorporate the block that represents the embedded circuit into the PLD circuitry, and used to check the correctness of the layout versus the schematic.

The physical view generator uses information in the master file 154, along with PLD pin information 224, to generate the physical view 206. The physical view generator reads each HDL pin name and the associated schematic PLD pin name from the master file. The PLD pin names are used to read the associated physical pin coordinates from an interface layout 224. The interface layout in a particular example application specifies the interconnect between an outermost level of the embedded circuit and the PLD circuit layout. The interface layout includes x-y coordinates of PLD pins and may be manually generated.

The physical view includes each HDL pin name of the embedded circuit, an associated schematic PLD pin name, and the physical chip coordinate read from the interface layout. The information in the physical view may be used to verify that the pins between the PLD circuitry and the embedded circuitry match up physically between an interface layout and a place-and-route database.

The test view generator 216 generates a test view 208 that includes two sets of test patterns. One set of test patterns includes the core test patterns for testing functions of the embedded circuitry, and the other set of test patterns includes the test patterns for testing logic that provides controls between the core functions of the embedded circuit and the PLD logic. The test view further includes a test wrapper HDL file which calls an HDL sub-block to verify correct circuit behavior.

Figure 3:
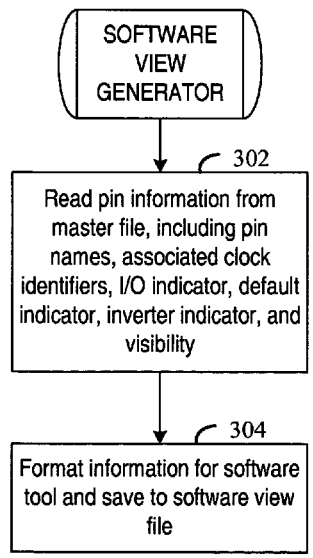
FIG. 3 is a flowchart of a process for generating a software view of a design in accordance with one or more embodiments of the invention.

FIG. 3 is a flowchart of a process for generating a software view of a design in accordance with one or more embodiments of the invention. The particular format of the information in the software view depends on the particular tool needing the information. Examples of such tools include synthesizers, simulators and other modeling tools.

The process reads pin information from the master file (step 302) and saves the information (step 304) in a format that is suitable for the further processing by other tools.

Figure 4:
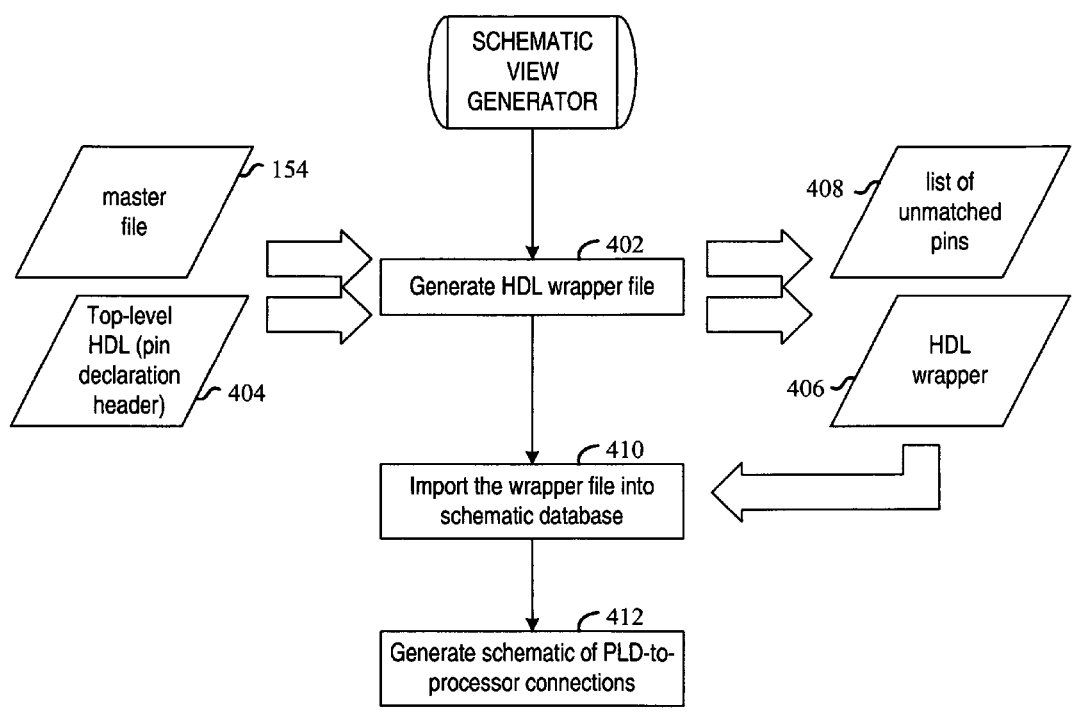
FIG. 4 is a flowchart of an example process for generating a schematic view in accordance with one or more embodiments of the invention.

FIG. 4 is a flowchart of an example process for generating a schematic view in accordance with one or more embodiments of the invention. The process uses information from the master file 154 and the top-level HDL module (404) of the embedded circuit to generate an HDL wrapper that calls the top-level HDL module (step 402).

The code below in Example 1 illustrates a fragment of an example master file.
LSSDSCANOUT14# lssdscanout<14>#
tertiary_logic_outs__1__1<6># UNUSED# output# data# FALSE# UNUSED#
LSSDSCANOUT15# lssdscanout<15>#
tertiary_logic_outs__1__1<7># UNUSED# output# data# FALSE# UNUSED#
TSTISOCMC405readdataouti20#
tst_isocmc405readdataout_i°20># imux__1__2<15># UNUSED#input# data# FALSE# 0# SH, CPMC405CLOCK, POSEDGE, BOTH#
TSTISOCMC405READDATAOUTI21#
tst_isocmc405readdataout_i<21># imux__1__2<16># UNUSED#input# data# FALSE# 0# SH, CPMC405CLOCK, POSEDGE, BOTH#
TSTISOCMC405READDATAOUTI22#
tst_isocmc405readdataout_i>22># imux__1__2<17># UNUSED#input# data# FALSE# 0# SH, CPMC405CLOCK, POSEDGE, BOTH#
TSTISOCMC405READDATAOUTI23#
tst_isocmc405readdataout_i<23># imux__1__2<18># UNUSED#input# data# FALSE# 0# SH, CPMC405CLOCK, POSEDGE, BOTH# DCREMACENABLER# dcremacenabler# best_logic_outs__1__2<7>#UNUSED# output# data#FALSE# UNUSED#

EXAMPLE 1

As explained above, each entry in the master file includes the designer-visible HDL pin name of the embedded circuit, the corresponding schematic PLD pin name (for use in a schematic database), the name of the PLD pin to which the embedded circuit pin is to connect, the name of the clock that will trigger the signal on the pin, the mode of that signal (test vs. user), and whether the signal has a permanent default value. Each field in an entry is delimited by a "#". Some entries in the master file include additional information such as fields that indicate a number of clock edges and information that identifies and describes a reference clock.

The code below in Example 2 illustrates a fragment of an example top-level HDL module.
module proc_emac_top (
tst_trstnet_o, tst_timeren_o, tst_resetsy6s_o,
tst_resetcore_o,
tst_resetchip_o, tst_jtagen_o,
tst_isocmc405readdataout_o,
tst_isocmc405rddvalid_o, tst_isocmc405hold_o,
tst_dsocmc405rddbus_o, tst_dsocmc405hold_o,
tst_dsocmc405disoperandfwd_o,
tst_dsocmc405complete_o,
tst_dcrc405dbusin_o, tst_dcrc405ack_o,
tst_cpuclken_o,
tst_cpuclk_o, tst_clkinact_o,
tst_c405isocmxltvalid_o,
tst_c405isomreqpending_o, tst_c405isocmicuready_o,
tst_c405isocmabus_o, tst_c405isocmabort_o,
tst_c405dsocmxltvalid_o, tst_c405dsocmwrdbus_o,
tst_c405dsocmwait_o, tst_c405dsocmstorereq_o,
tst_c405dsocmloadreq_o, tst_c405dsocmbyteen_o,
tst_c405dsocmabus_o, tst_c405dsocmabortreq_o,
tst_c405dsocmabortop_o, tst_c405apuxerca_o,
tst_c405apuwbhold_o,
tst_c405apuwbflush_o, tst_c405apuwbendian_o
)

EXAMPLE 2

The top-level HDL specifies all the input and output pins of the embedded circuit. In the example HDL the "_o" suffix on the pin names indicates that the pins are output pins. Other names (not shown) in the HDL block have a "_i" suffix for input pins.

The code below in Example 3 illustrates an example HDL wrapper that is generated from the example master file and top-level HDL of Examples 1 and 2 above.
proc_emac_top Ippc_emac_top(
.tst_trstneg_o({
tertiary_logic_outs_r__15[7]
}),
.tst_timeren_o({
tertiary_logic_outs_b__0[2]
}),
.tst_resetsys_o({
tertiary_logic_outs_r__15[6]
}),
.tst_resetcore_o({
tertiary_logic_outs_r__15[4]
}),
.tst_resetchip_o({
tertiary_logic_outs_r__15[5]
}),
.tst_plbsamplecycle_o({
secondary_logic_outs_l__21[4]
}),
.tst_jtagen_o({
tertiary_logic_outs_b__0[3]
}),
.tst_osocmc405readdataout_o({
tertiary_logic_outs_r__3[0], tertiary_logic_outs_r__3[1],
tertiary_logic_outs_r__3[2], tertiary_logic_outs_r__3[3],
tertiary_logic_outs_r__3[4], tertiary_logic_outs_r__3[5],
tertiary_logic_outs_r__3[6], tertiary_logic_outs_r__3[7],
tertiary_logic_outs_r__2[0], tertiary_logic_outs_r__1[1],
tertiary_logic_outs_r__2[2], tertiary_logic_outs_r__2[3],
tertiary_logic_outs_r__2[4], tertiary_logic_outs_r__2[5],
tertiary_logic_outs_r__2[6], tertiary_logic_outs_r__2[7],
tertiary_logic_outs_r__1[0], tertiary_logic_outs_r__1[1],
tertiary_logic_outs_r__1[2], tertiary_logic_outs_r__1[3],
tertiary_logic_outs_r__1[4], tertiary_logic_outs_r__1[5],
tertiary_logic_outs_r__1[6], tertiary_logic_outs_r__1[7],
tertiary_logic_outs_r__0[2], tertiary_logic_outs_r__0[3],
tertiary_logic_outs_r__0[4], tertiary_logic_outs_r__0[5],
tertiary_logic_outs_r__0[6], tertiary_logic_outs_r__0[7],
tertiary_logic_outs_l__15[0], tertiary_logic_outs_l__15[1],
tertiary_logic_outs_l__15[2], tertiary_logic_outs_l__15[3],
tertiary_logic_outs_l__14[0], tertiary_logic_outs_l__14[1],
tertiary_logic_outs_l__14[2], tertiary_logic_outs_l__14[3],
tertiary_logic_outs_l__13[0], tertiary_logic_outs_l__13[1],
tertiary_logic_outs_l__13[2], tertiary_logic_outs_l__13[3],
tertiary_logic_outs_l__12[0], tertiary_logic_outs_l__12[1],
tertiary_logic_outs_l__12[2], tertiary_logic_outs_l__12[3],
tertiary_logic_outs_l__11[0], tertiary_logic_outs_l__11[1], tertiary_logic_outs_1__11[2], tertiary_logic_outs_1__11[3],
tertiary_logic_outs_1__10[0], tertiary_logic_outs_1__10[1],
tertiary_logic_outs_1__10[2], tertiary_logic_outs_1__10[3],
tertiary_logic_outs_1__9[0], tertiary_logic_outs_1__9[1],
tertiary_logic_outs_1__9[2], tertiary_logic_outs_1__9[3],
tertiary_logic_outs_1__8[0], tertiary_logic_outs_1__8[1],
tertiary_logic_outs_1__8[2], tertiary_logic_outs_1__8[3]}),
.tst_isocmc405rddvalid_o({
tertiary_logic_outs_b__0[4], teriary_logic_outs_b__0[5]}),
.tst_isocmc405hold_o({
tertiary_logic_outs_b__0[6]
}),
.tst_dsocmc405rddbus_o({
tertiary_logic_outs_1__15[4], tertiary_logic_outs_1__15[5],
tertiary_logic_outs_1__15[6], tertiary_logic_outs_1__15[7],
tertiary_logic_outs_1__14[4], tertiary_logic_outs_1__14[5],
tertiary_logic_outs_1__14[6], tertiary_logic_outs_1__14[7],
tertiary_logic_outs_1__13[4], tertiary_logic_outs_1__13[5],
tertiary_logic_outs_1__13[6], tertiary_logic_outs_1__13[7],
tertiary_logic_outs_1__12[4], tertiary_logic_outs_1__12[5],
tertiary_logic_outs_1__12[6], tertiary_logic_outs_1__12[7],
tertiary_logic_outs_1__11[4], tertiary_logic_outs_1__11[5],
tertiary_logic_outs_1__11[6], tertiary_logic_outs_1__11[7],
tertiary_logic_outs_1__10[4], tertiary_logic_outs_1__10[5],
tertiary_logic_outs_1__10[6], tertiary_logic_outs_1__10[7],
tertiary_logic_outs_1__9[4], tertiary_logic_outs_1__9[5],
tertiary_logic_outs_1__9[6], tertiary_logic_outs_1__9[7],
tertiary_logic_outs_1__8[4], tertiary_logic_outs_1__8[5],
tertiary_logic_outs_1__8[6], tertiary_logic_outs_1__7[7]}),
.tst_dsocmd405hold_o({
tertiary_logic_outs_r__15[2]}),
tst_dsocmc405disoperandfwd_o({
tertiary_logic_outs_r__15[1]
}),
.tst_dsocmc405complete_o({
tertiary_logic_outs_r__15[0]
}),
.tst_dcrc405dbusin_o{
secondary_logic_outs_1__20[0], secondary_logic_outs_1__20[1],
secondary_logic_outs_1__20[2], secondary_logic_outs_1__20[3],
secondary_logic_outs_1__19[0], secondary_logic_outs_1__19[1],
secondary_logic_outs_1__19[2], secondary_logic_outs_1__19[3],
secondary_logic_outs_1__18[0], secondary_logic_outs_1__18[1],
secondary_logic_outs_1__18[2], secondary_logic_outs_1__18[3],
secondary_logic_outs_1__11[0], secondary_logic_outs_1__11[1],
secondary_logic_outs_1__11[2], secondary_logic_outs_1__11[3],
secondary_logic_outs_1__10[0], secondary_logic_outs_1__10[1],
secondary_logic_outs_1__10[2], secondary_logic_outs_1__10[3],
secondary_logic_outs_1__5[0], secondary_logic_outs_1__5[1],
secondary_logic_outs_1__5[2], secondary_logic_outs_1__5[3],
secondary_logic_outs_1__3[0], secondary_logic_outs_1__3[1],
secondary_logic_outs_1__3[2], secondary_logic_outs_1__3[3],
secondary_logic_outs_1__2[0], secondary_logic_outs_1__2[1],
secondary_logic_outs_1__2[2], secondary_logic_outs_1__2[3],
})

EXAMPLE 3

The wrapper maps HDL (software) pin names to PLD (hardware) pin names in HDL format. This HDL wrapper may be imported into schematic design tools for use in a schematic view. The wrapper may be generated by reading the needed information from the master file and the top-level HDL module of the embedded circuit and combining the information into HDL statements.

In addition to generating the HDL wrapper 406, any unmatched pins are identified (408) and saved for examination. Any pin name mismatch between the master file and top-level HDL module is detected and reported. The mismatch may be determined by identifying any pin name in the top-level HDL that is not present in the master file is reported.

Connecting the embedded circuit to the interface is accomplished by importing the wrapper HDL file into a schematic database and connecting the interface to the pins of the embedded circuit. The HDL wrapper 406 is imported into the database of a schematic tool (step 410). For example, the HDL wrapper may be imported into the schematic database used by various design tools. This schematic represents the connection between the embedded circuit and the interface (e.g., FIG. 1, embedded circuit 106 to interface 108).

The combined schematic representation may be further used to verify the correctness of the layout versus the schematic. The verification may be performed by extracting a first netlist based on a physical layout database (e.g., FIG. 1B, chip layout specification 134) and extracting a second netlist based on the schematic database. If the two netlists are the same, the layout matches the schematic, and no error is identified. If the netlists do not match, a designer may trace the layout and change the layout to match the schematic.

Figure 5:
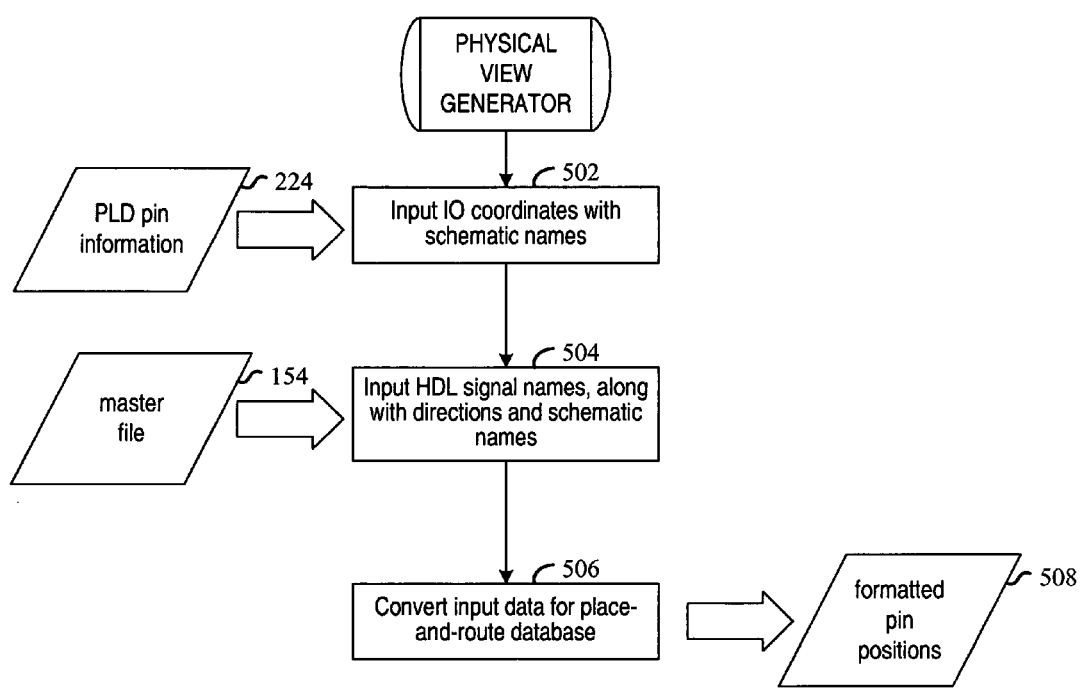
FIG. 5 is a flowchart of an example process for generating a physical view in accordance with one or more embodiments of the invention.

FIG. 5 is a flowchart of an example process for generating a physical view in accordance with one or more embodiments of the invention. In generating the physical view, the I/O coordinates are input with schematic PLD pin names (step 502). The data fragment in Example 4 below illustrates this data.

...
3.7 3.84 3.77 sr_1__1<1>
4.66 4.8 4.73 imux_1__1<16>
5.62 5.76 5.69 imux_;__1<12>
6.58 6.72 6.65 best_logic_outs_1__1<4>
7.54 7.68 7.61 secondary_logic_outs_1__1<1>
8.5 8.64 8.57 sr_1__1<0>
9.46. 9.6 9.53 sr_1__1<3>
...

EXAMPLE 4

In the example data, the three leading decimal numbers are the coordinates. The three coordinates include: $X_1$, $X_2$, and $X_{mid}$, $X_1$ is one edge of the pin, $X_2$ is the other edge, and $X_{mid}$ is the mid point between $X_1$ and $X_2$ ($X_{mid}=(X_1+X_2)/2$). The midpoint is later used in the place-and-route processing. The $X_1$ and $X_2$ values are read from the interface layout.

No y coordinate is listed for the pins because in an example implementation the coordinates are provided in 4 sets, one set for each of 4 sides (top, bottom, left, and right) of a rectangle that bounds the embedded circuit. Thus, the set of coordinates for the top boundary has a single y-coordinate value and a set of multiple x-coordinate values. The set of coordinates for the bottom boundary has another single y-coordinate value and a set of multiple x-coordinate values. Similarly, the coordinate sets for the left and right sides have respective single x-coordinate values and associated sets of y-coordinate values.

The HDL pin names are input from the master file 154, along with respective signal directions and schematic PLD pin names (step 504). The data fragment in Example 5 below illustrates each schematic PLD pin name, followed by the associated HDL pin name, and the associated signal direction.

```
. . .
clk_1_1<0> phyemac0rxclk input
ce_1_1<0> tieemac0unicastaddr<37> input
ce_1_1<1> tieemac0unicastaddr<38> input
ce_1_1<2> tieemac0unicastaddr<39> input
ce_1_1<3> tieemac0unicastaddr<40> input
sr_1_1<0> tieemac0unicastaddr<41> input
sr_1_1<1> tieemac0unicastaddr<42> input
sr_1_1<2> tieemac0unicastaddr<43> input
sr_1_1<3> tieemac0unicastaddr<44> input
imux_1_2<0> phyemac0rxnotintable input
imux_1_2<1> phyemac0rxdisperr input
imux_1_2<2> phyemac0rxcharisk input
imux_1_2<3> phyemac0rxchariscomma rxnotintable input
imux_1_2<4> phyemac0rxlossofsync<0> input
imux_1_2<5> phyemac0rxloxxofsync<1> input
```

EXAMPLE 5

The input information from steps 502 and 504 is converted to a format suitable for a place-and-route database (step 506 and block 508). For example, the coordinates may be converted to units compatible with the place-and-route database. The code fragment in Example 6 below illustrates the formatted information. Each statement is delimited by a semicolon.

. . .

tieemac0configvec[23]+NET timeemac0configvec[23]+DIRECTION input+USE SIGNAL+LAYER MET6(−133 0) (133 741)+PLACED (828267 0)N;
tst_clkinact_o+NET tst_clkinact_o+DIRECTION output+ USE SIGNAL+LAYER MET6(−133 0) (133 741)+ PLACED(789355 0)N;
isocmbramwrdbus[22]+NET isocmbramwrdbus[22]+DIRECTION output+USE SIGNAL+LAYER MET6(−133 0)(133 741)+PLACED(1309727 0)N;
bramisocmrddbus[17]+NET bramisocmrddbus[17]+DIRECTION input+USE SIGNAL+LAYER MET6(−133 0)(133 741)+PLACED(2833413 0)N;
tiec405dcumargin+NET t6iec405dcumargin+DIRECTION input+USE SIGNAL+LAYER MET6(−133 0)(133 741)+ PLACED(2907589 0)N;
eicc405critinputirq+NET eicc405critinputirq+DIRECTION input+USE SIGNAL+LAYER MET6(−133 0)(133 741)+ PLACED(2675067 0)N;
tieemac0unicastaddr[42]+NET tieemac0unicastaddr[42]+ DIRECTION input+USE SIGNAL+LAYER MET6(−133 0)(133 741)+PLACED(111682 0)N;
phyemac0col+NET phyemac0col+DIRECTION input+USE SIGNAL+LAYER MET6(−133 0)(133 741)+PLACED (61522 0)N;

EXAMPLE 6

Figure 6:
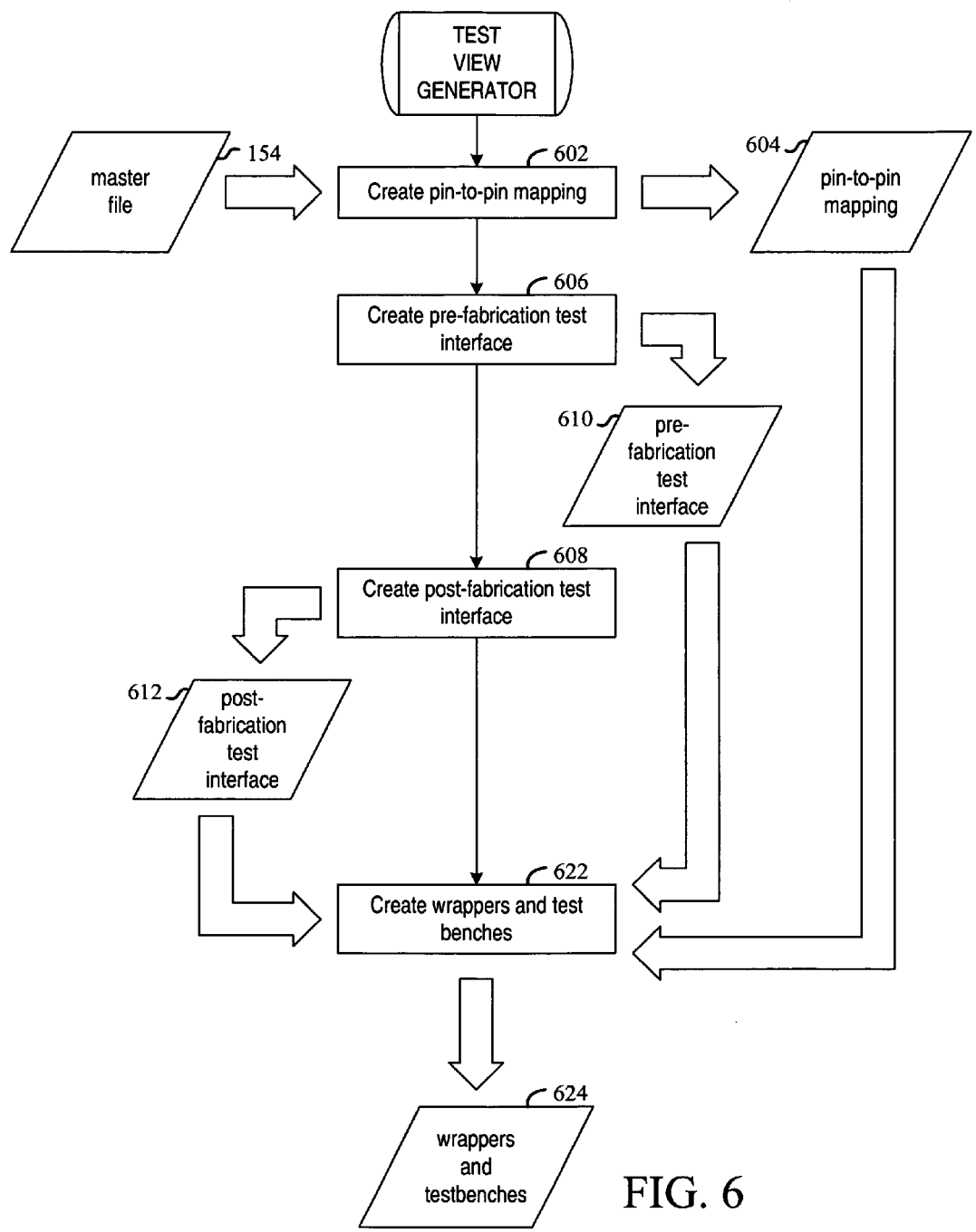
FIG. 6 is a flowchart of an example process for generating a test view in accordance with various embodiments of the invention.

FIG. 6 is a flowchart of an example process for generating a test view in accordance with various embodiments of the invention. In an example embodiment, generating a test view includes generating a first test interface for use in pre-fabrication testing of the PLD circuit design and a second interface for use in testing the fabricated PLD having an embedded circuit.

The data fragment in Example 7 illustrates a portion of a master file used in describing the process of FIG. 6. The leading information in Example 7 includes headers that describe each field in the data fragment. A pin-to-pin mapping 604 is created (step 602). The pin-to-pin mapping (Example 8) includes schematic PLD pin names and associated HDL pin names read from the master file 154.

At steps 606 and 608, pre-fabrication and post-fabrication test interfaces 610 and 612 are also generated. The pre-fabrication test interface 610 is a list of the pin names based on the HDL pin names of the embedded circuit that may be used in generating a test of the PLD circuit design, for example, a simulation test bench. The post-fabrication test interface 612 is a list of pin names based on the schematic PLD pin names of the embedded circuit that may be used in generating tests for a fabricated device. Example 9 illustrates an example post-fabrication test interface, and Example 10 illustrates a pre-fabrication test interface.

. . .

```
#,,,,,,,,,,,,,,,,,
tile0,,,,,,,,,,,,,,,,,
#,,,,,,,,,,,,,,,,,
input,BRAMDSOCMRDDBUS[0],BRAMDSOCMCLK,
    pos,0,"mode(user, gasket_test)",,,,,,,,,,,,
input,BRAMDSOCMRDDBUS[1],BRAMDSOCMCLK,
    pos,0,"mode(user, gasket_test)",,,,,,,,,,,,
input,BRAMDSOCMRDDBUS[2],BRAMDSOCMCLK,
    pos,0,"mode(user, gasket_test)",,,,,,,,,,,,
input,BRAMDSOCMRDDBUS[3],BRAMDSOCMCLK,
    pos,0,"mode(user, gasket_test)",,,,,,,,,,,,
input,BRAMDSOCMRDDBUS[4],BRAMDSOCMCLK,
    pos,0,"mode(user, gasket_test)",,,,,,,,,,,,
input,BRAMDSOCMRDDBUS[5],BRAMDSOCMCLK,
    pos,0,"mode(user, gasket_test)",,,,,,,,,,,,
input,BRAMDSOCMRDDBUS[6],BRAMDSOCMCLK,
    pos,0,"mode(user, gasket_test)",,,,,,,,,,,,
input,BRAMDSOCMRDDBUS[7],BRAMDSOCMCLK,
    pos,0,"mode(user, gasket_test)",,,,,,,,,,,,
output1,DSOCMBRAMWRDBUS[0],BRAMDSOCM-
    CLK,pos,,"mode(user, gasket_test)",,,,,,,,,,,
output1,DSOCMBRAMWRDBUS[1],BRAMDSOCM-
    CLK,pos,,"mode(user, gasket_test)",,,,,,,,,,,
output1,DSOCMBRAMWRDBUS[2],BRAMDSOCM-
    CLK,pos,,"mode(user, gasket_test)",,,,,,,,,,,
output1,DSOCMBRAMWRDBUS[3],BRAMDSOCM-
    CLK,pos,,"mode(user, gasket_test)",,,,,,,,,,,
output1,DSOCMBRAMWRDBUS[4],BRAMDSOCM-
    CLK,pos,,"mode(user, gasket_test)",,,,,,,,,,,
output1,DSOCMBRAMWRDBUS[5],BRAMDSOCM-
    CLK,pos,,"mode(user, gasket_test)",,,,,,,,,,,
output1,DSOCMBRAMWRDBUS[6],BRAMDSOCM-
    CLK,pos,,"mode(user, gasket_test)",,,,,,,,,,,
output1,DSOCMBRAMWRDBUS[7],BRAMDSOCM-
    CLK,pos,,"mode(user, gasket_test)",,,,,,,,,,,
``` output2,DSOCMBRAMABUS[24],BRAMDSOCMCLK,
  pos,,"mode(user, gasket_test)",,,,,,,,,,,,
output2,DSOCMBRAMABUS[25],BRAMDSOCMCLK,
  pos,,"mode(user, gasket_test)",,,,,,,,,,,,
output2,DSOCMBRAMABUS[26],BRAMDSOCMCLK,
  pos,,"mode(user, gasket_test)",,,,,,,,,,,,
output2,DSOCMBRAMABUS[27],BRAMDSOCMCLK,
  pos,,"mode(user, gasket_test)",,,,,,,,,,,,
test_output,TSTC405APUEXERADATAO[24],CPMFCM-
  CLK,pos,,mode(cor e_test),,,,,,,,,,,,
test_output,TSTC405APUEXERADATAO[25],CPMFCM-
  CLK,pos,,mode(cor e_test),,,,,,,,,,,,
test_output,TSTC405APUEXERADATAO[26],CPMFCM-
  CLK,pos,,mode(cor e_test),,,,,,,,,,,,
test_output,TSTC405APUEXERADATAO[27],CPMFCM-
  CLK,pos,,mode(cor e_test),,,,,,,,,,,,
clk,BRAMDSOCMCLK,,,1,"mode(user, gasket_test)",inv,,
  ,,,,,,,,,,
control1,DSARCVALUE[0],,,0,"mode(user,gasket_test)",
  inv,,,,,,,,,,,
control1,DSARCVALUE[1],,,0,"mode(user,gasket_test)",
  inv,,,,,,,,,,,
control1,DSARCVALUE[2],,,0,"mode(user,gasket_test)",
  inv,,,,,,,,,,,
control1,DSARCVALUE[3],,,0,"mode(user,gasket_test)",
  inv,,,,,,,,,,,
control2,DSARCVALUE[4],,,0,"mode(user,gasket_test)",
  inv,,,,,,,,,,,
control2,DSARCVALUE[5],,,0,"mode(user,gasket_test)",
  inv,,,,,,,,,,,
control2,DSARCVALUE[6],,,0,"mode(user,gasket_test)",
  inv,,,,,,,,,,,
control2,DSARCVALUE[7],,,0,"mode(user,gasket_test)",
  inv,,,,,,,,,,,
,,,,,,,,,,,,,,,,.
. . .

EXAMPLE 7

I/O End-user Test Name

Designer Test Name

HDL Name
IN TSTISOCMC405READDATAOUTI[28]
tst_isocmc405readdataout_i<28>
ISOCMC405RDDBUS28
IN TSTISOCMC405READDATAOUTI[29]
tst_isocmc405readdataout_i<29>
ISOCMC405RDDBUS29
IN TSTISOCMC405READDATAOUTI[30]
tst_isocmc405readdataout_i<30>
ISOCMC405RDDBUS30
IN TSTISOCMC405READDATAOUTI[31]
tst_isocmc405readdataout_i<31>
ISOCMC405RDDBUS31
IN TSTISOCMC405READDATAOUTI[24]
tst_isocmc405readdataout_i<24>
ISOCMC405RDDBUS24
IN TSTISOCMC405READDATAOUTI[25]
tst_isocmc405readdataout_i<25>
ISOCMC405RDDBUS25
IN TSTISOCMC405READDATAOUTI[26]
tst_isocmc405readdataout_i<26>
ISOCMC405RDDBUS26
IN TSTISOCMC405READDATAOUTI[27]
tst_isocmc405readdataout_i<27>
ISOCMC405RDDBUS27
IN TSTISOCMC405READDATAOUTI[20]
tst_isocmc405readdataout_i<20>
ISOCMC405RDDBUS20
. . .
OUT TSTC405APUEXERBDATAO[10]
tst_c405apuexerbdata_o<10>
C405APUEXERBDATA10
OUT TSTC405APUEXERBDATAO[11]
tst_c405apuexerbdata_o<11>
C405APUEXERBDATA11
OUT TSTC405APUEXERBDATAO[12]
tst_c405apuexerbdata_o<12>
C405APUEXERBDATA12
OUT TSTC405APUEXERBDATAO[13]
tst_c405apuexerbdata_o<13>
C405APUEXERBDATA13
OUT TSTC405APUEXERBDATAO[14]
tst_c405apuexerbdata_o<14>
C405APUEXERBDATA14
OUT TSTC405APUEXERBDATAO[15]
tst_c405apuexerbdata_o<15>
C405APUEXERBDATA15
OUT TSTC405APUEXERBDATAO[0]
tst_c405apuexerbdata_o<0>
C405APUEXERBDATA0
OUT TSTC405APUEXERBDATAO[1]
tst_c405apuexerbdata_o<1>
C405APUEXERBDATA1
OUT TSTC405APUEXERBDATAO[2]
tst_c405apuexerbdata_o<2>
C405APUEXERBDATA2
OUT TSTC405APUEXERBDATAO[3]
tst_c405apuexerbdata_o<3>
C405APUEXERBDATA3
OUT TSTC405APUEXERBDATAO[4]
tst_c405apuexerbdata_o<4>
C405APUEXERBDATA4
OUT TSTC405APUEXERBDATAO[5]
tst_c405apuexerbdata_o<5>
C405APUEXERBDATA5
OUT TSTC405APUEXERBDATAO[6]
tst_c405apuexerbdata_o<6>
C405APUEXERBDATA6
OUT TSTC405APUEXERBDATAO[7]
tst_c405apuexerbdata_o<7>
C405APUEXERBDATA7

EXAMPLE 8

TSTISOCMC405READDATAOUTI[28]
TSTISOCMC405READDATAOUTI[29]
TSTISOCMC405READDATAOUTI[30]
TSTISOCMC405READDATAOUTI[31]
TSTISOCMC405READDATAOUTI[24]
TSTISOCMC405READDATAOUTI[25]
TSTISOCMC405READDATAOUTI[26]
TSTISOCMC405READDATAOUTI[27]
TSTISOCMC405READDATAOUTI[20]
TSTISOCMC405READDATAOUTI[21]
TSTISOCMC405READDATAOUTI[22]
TSTISOCMC405READDATAOUTI[23]
TSTISOCMC405READDATAOUTI[16]
TSTISOCMC405READDATAOUTI[17]
TSTISOCMC405READDATAOUTI[18]
TSTISOCMC405READDATAOUTI[19]
TSTISOCMC405READDATAOUTI[12]

TSTISOCMC405READDATAOUTI[13]
TSTISOCMC405READDATAOUTI[14]
TSTISOCMC405READDATAOUTI[15]
. . .

EXAMPLE 9

. . .
tst_isocmc405readdataout_i<28>
tst_isocmc405readdataout_i<29>
tst_isocmc405readdataout_i<30>
tst_isocmc405readdataout_i<31>
tst_isocmc405readdataout_i<24>
tst_isocmc405readdataout_i<25>
tst_isocmc405readdataout_i<26>
tst_isocmc405readdataout_i<27>
tst_isocmc405readdataout_i<20>
tst_isocmc405readdataout_i<21>
tst_isocmc405readdataout_i<22>
tst_isocmc405readdataout_i<23>
tst_isocmc405readdataout_i<16>
tst_isocmc405readdataout_i<17>
tst_isocmc405readdataout_i<18>
tst_isocmc405readdataout_i<19>
tst_isocmc405readdataout_i<12>
tst_isocmc405readdataout_i<13>
tst_isocmc405readdataout_i<14>
tst_isocmc405readdataout_i<15>
. . .

EXAMPLE 10

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of tools for use in embedding one circuit design in another circuit design and has been found to be particularly applicable and beneficial in embedding a processor design in a PLD. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for generating consistent connection data for a first circuit design embedded in a second circuit design, comprising:
    establishing in a master file design data including for each pin in the first circuit design, a hardware description language (HDL) pin name from an HDL description of the first circuit design, a schematic pin name of the second circuit design to which the pin of the first circuit is to connect, a signal direction associated with the pin, and a name of a clock to trigger a signal on the pin; and
    generating a plurality of design views from the master file, each design view having a unique format relative to the other design views and including for each pin in the first circuit design, at least the HDL pin name, the associated schematic pin name from the second circuit design, and a signal direction associated with the pin.

2. The method of claim 1, wherein the master file further includes for each pin in the embedded circuit design, a value that indicates whether the pin has a permanent default value, and at least one design view includes for each pin the associated name of a clock to trigger a signal on the pin and the associated value indicating whether the pin has a permanent default value.

3. The method of claim 1, wherein at least one design view includes an HDL description of the connections between the HDL pin names and associated schematic pin names in a format suitable for schematic capture.

4. The method of claim 3, further comprising:
    determining from the master file HDL pin names of the first circuit design and associated schematic pin names of the second circuit design;
    determining the input and output pins of the embedded circuit from a top-level HDL module of the first circuit design using the HDL pin names from the master file; and
    generating an HDL wrapper that maps HDL pin names to PLD pin names.

5. The method of claim 4, further comprising:
    reading an HDL file that describes the first circuit;
    determining whether any pin is named in the HDL file and not named in the master file; and
    outputting data that identifies each pin named in the HDL file and not named in the master file.

6. The method of claim 3, further comprising:
    reading an HDL file that describes the first circuit;
    determining whether any pin is named in the HDL file and not named in the master file; and
    outputting data that identifies each pin named in the HDL file and not named in the master file.

7. The method of claim 1, further comprising:
    reading position information of the pins of the second circuit from an interface description of pins of the second circuit; and
    wherein at least one of the design views includes for each pin in the first circuit design, associated position information of the pins of the second circuit in a format suitable for a place-and-route tool.

8. The method of claim 1, wherein at least one of the design views includes a first set of pin names derived from HDL pin names of the first circuit design.

9. The method of claim 8, wherein at least one of the design views includes a second set of pin names derived from HDL pin names of the first circuit design, and the names in the second set are different from the names in the first set.

10. The method of claim 1, further comprising:
    determining from the master file HDL pin names of the first circuit design and associated schematic pin names of the second circuit design;
    determining the input and output pins of the embedded circuit from a top-level HDL module of the first circuit design using the HDL pin names from the master file;
    generating an HDL wrapper that maps HDL pin names to PLD pin names;
    reading position information of the pins of the second circuit from an interface description of pins of the second circuit; and
    wherein at least one of the design views includes for each pin in the first circuit design, associated position information of the pins of the second circuit in a format suitable for a place-and-route tool.

11. The method of claim 10, further comprising:
reading an HDL file that describes the first circuit;
determining whether any pin is named in the HDL file and not named in the master file; and
outputting data that identifies each pin named in the HDL file and not named in the master file.

12. The method of claim 11, wherein at least one of the design views includes a first set of pin names derived from HDL pin names of the first circuit design.

13. The method of claim 12, wherein at least one of the design views includes a second set of pin names derived from HDL pin names of the first circuit design, and the names in the second set are different from the names in the first set.

14. An apparatus for generating consistent connection data for a first circuit design embedded in a second circuit design, comprising:

means for establishing in a master file design data including for each pin in the first circuit design, a hardware description language (HDL) pin name from an HDL description of the first circuit design, a schematic pin name of the second circuit design to which the pin of the first circuit is to connect, a signal direction associated with the pin, and a name of a clock to trigger a signal on the pin; and means for generating a plurality of design views from the master file, each design view having a unique format relative to the other design views and including for each pin in the first circuit design, at least the HDL pin name, the associated schematic pin name from the second circuit design, and a signal direction associated with the pin.

* * * * *